United States Patent
Zhang

(10) Patent No.: US 9,768,054 B2
(45) Date of Patent: Sep. 19, 2017

(54) HIGH VOLTAGE DEVICE WITH LOW RDSON

(71) Applicant: GLOBALFOUNDRIES Singapore Pte. Ltd., Singapore (SG)

(72) Inventor: Guowei Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 1 day.

(21) Appl. No.: 14/951,523

(22) Filed: Nov. 25, 2015

(65) Prior Publication Data

US 2016/0155797 A1 Jun. 2, 2016

Related U.S. Application Data

(60) Provisional application No. 62/085,318, filed on Nov. 27, 2014.

(51) Int. Cl.
| | |
|---|---|
| H01L 21/762 | (2006.01) |
| H01L 29/78 | (2006.01) |
| H01L 29/06 | (2006.01) |
| H01L 29/08 | (2006.01) |
| H01L 29/66 | (2006.01) |

(52) U.S. Cl.
CPC .... *H01L 21/76224* (2013.01); *H01L 29/0653* (2013.01); *H01L 29/0692* (2013.01); *H01L 29/0847* (2013.01); *H01L 29/66659* (2013.01); *H01L 29/7835* (2013.01); *H01L 29/665* (2013.01)

(58) Field of Classification Search
CPC .......... H01L 21/26586; H01L 29/0653; H01L 21/26506; H01L 29/063; H01L 29/7816
See application file for complete search history.

(56) References Cited

U.S. PATENT DOCUMENTS

| | | | |
|---|---|---|---|
| 2010/0090278 A1* | 4/2010 | Rohrer | H01L 29/0653 257/339 |
| 2010/0096697 A1* | 4/2010 | Su | H01L 21/26586 257/343 |
| 2011/0147844 A1* | 6/2011 | Smith | H01L 29/0653 257/368 |
| 2011/0156141 A1* | 6/2011 | Roig-Guitart | H01L 29/0653 257/335 |
| 2013/0181287 A1* | 7/2013 | Zhang | H01L 21/26506 257/335 |

(Continued)

*Primary Examiner* — Kenneth Parker
*Assistant Examiner* — Fang-Xing Jiang
(74) *Attorney, Agent, or Firm* — Horizon IP PTE. Ltd.

(57) ABSTRACT

High voltage devices and methods for forming thereof are disclosed. A high voltage device includes a substrate having a device region, where the device region includes a source region and a drain region defined thereon. A transistor is disposed on the device region. The transistor includes a gate disposed over the substrate and in between the source and drain regions. First and second device wells are disposed in the substrate within the device region. The first device well is adjacent to a second side of the gate and the second device well is adjacent to a first side of the gate. Isolation regions are disposed within the substrate. The isolation regions include a device isolation region surrounding the device region and one or more isolation fingers disposed in a first portion of the device region adjacent to the first side of the gate.

18 Claims, 19 Drawing Sheets

(56) References Cited

U.S. PATENT DOCUMENTS

2013/0292764 A1* 11/2013 Yang .................... H01L 29/063
  257/336
2014/0339636 A1* 11/2014 Hsu ..................... H01L 29/7816
  257/343

* cited by examiner

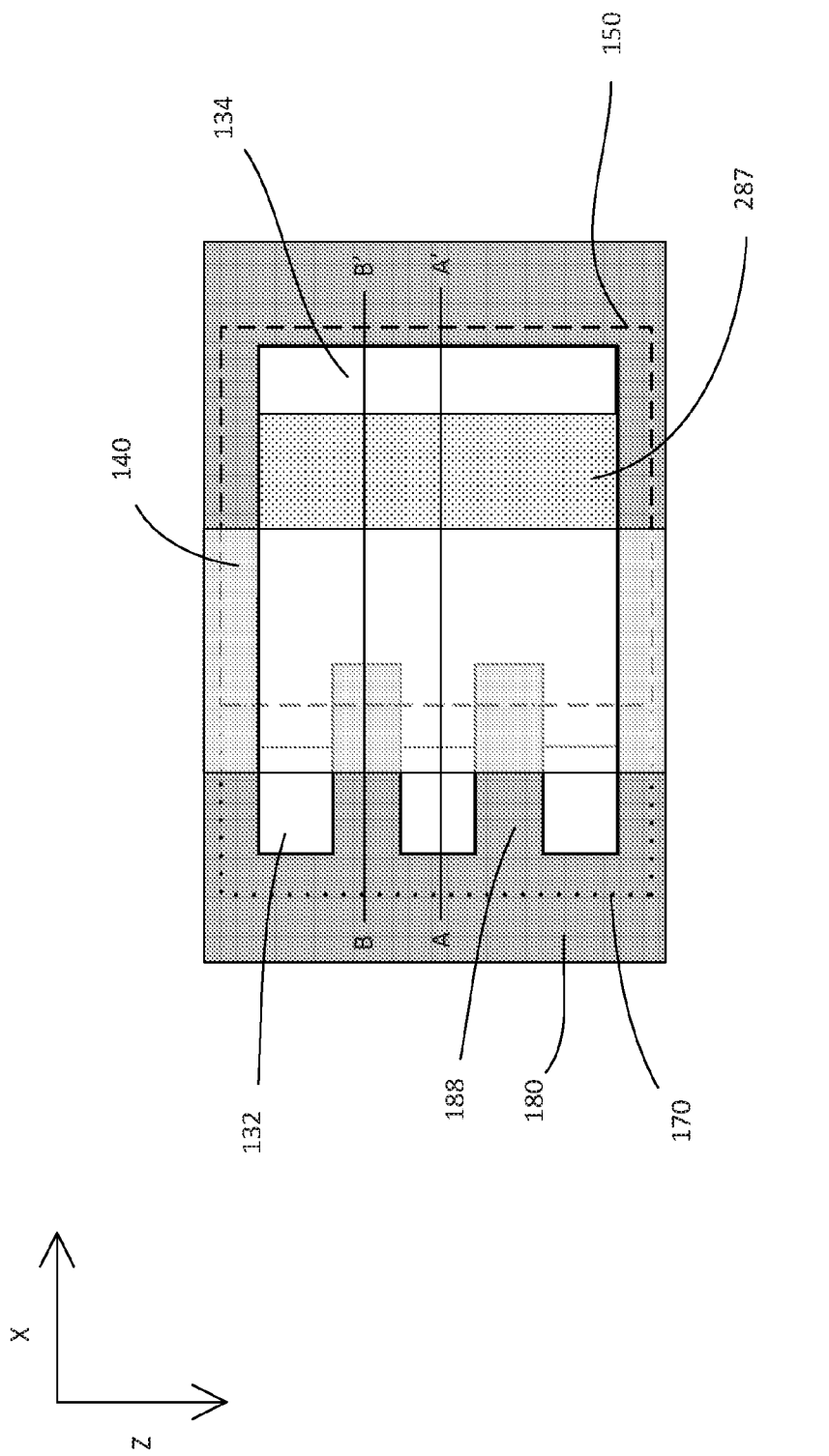

HIGH VOLTAGE DEVICE WITH LOW RDSON

CROSS-REFERENCE TO RELATED APPLICATION

This application claims the benefit of U.S. Provisional Application Ser. No. 62/085,318, filed on Nov. 27, 2014, which is herein incorporated by reference in its entirety for all purposes.

BACKGROUND

Lateral Double-Diffused (LD) transistors have been widely employed in high voltage applications. One factor which affects the performance of the LD transistors is the drain-to-source on-resistance ($R_{dson}$). For example, higher $R_{dson}$ undesirably results in reduced switching speeds and more energy loss during switching.

Various techniques have been employed to achieve lower $R_{dson}$. However, these conventional techniques may inadvertently result in higher impact ionization which compromises device reliability.

This disclosure is directed to transistors with low $R_{dson}$ and reduced impact ionization to improve device performance and reliability.

SUMMARY

Embodiments generally relate to high voltage devices and methods for forming thereof in one embodiment, a high voltage device is disclosed. The high voltage device includes a substrate having a device region, where the device region includes a source region and a drain region defined thereon. A transistor is disposed on the device region. The transistor includes a gate disposed over the substrate and in between the source and drain regions. First and second device wells are disposed in the substrate within the device region. The first device well is adjacent to a second side of the gate and the second device well is adjacent to a first side of the gate. Isolation regions are disposed within the substrate. The isolation regions include a device isolation region surrounding the device region and one or more isolation fingers disposed in a first portion of the device region adjacent to the first side of the gate.

In another embodiment, a high voltage device is presented. The device includes a substrate having a device region. The device region includes a source region and a drain region defined thereon. A transistor is disposed on the device region. The transistor includes a gate disposed over the substrate. The source region is disposed adjacent to a first or source side of the gate, the drain region is disposed on a second or drain side of the gate and is displaced away from the gate, and a channel region is disposed under the gate in between the source and drain regions. First and second device wells are disposed in the substrate within the device region. The first device well encompasses the drain region and underlaps a first portion of the gate and the second device well encompasses the source region and underlaps a second portion of the gate. Isolation regions are disposed within the substrate. The isolation regions include a device isolation region surrounding the device region and one or more isolation fingers disposed in a first portion of the device region adjacent to the source side of the gate.

In yet another embodiment, a method for forming a high voltage device is disclosed. The method includes providing a substrate having a device region. The device region includes a source region and a drain region defined thereon. A transistor is formed on the device region. The transistor includes a gate over the substrate. The source region is adjacent to a first or source side of the gate, the drain region is on a second or drain side of the gate and is displaced away from the gate, and a channel region is disposed under the gate in between the source and drain regions. First and second device wells are formed in the substrate within the device region. The first device well encompasses the drain region and underlaps a first portion of the gate and the second device well encompasses the source region and underlaps a second portion of the gate. Isolation regions are formed within the substrate. The isolation regions include a device isolation region surrounding the device region and one or more isolation fingers in a first portion of the device region adjacent to the source side of the gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIG. 1*a* shows a top view of the device and FIGS. 1*b*-1*c* show various cross-sectional views of the device while FIG. 1*d* shows a simplified top view of the device;

FIGS. 2*a*-2*d* show various views of another embodiment of a device. For example, FIG. 2*a* shows a top view of the device and FIGS. 2*b*-2*c* show various cross-sectional views of the device while FIG. 2*d* shows a simplified top view of the device;

DETAILED DESCRIPTION

Embodiments generally relate to semiconductor devices or integrated circuits (ICs). More particularly, embodiments relate to high voltage (HV) devices. For example, the HV devices include HV transistors. The HV transistors, for example, include lateral double-diffused metal oxide semiconductor (LDMOS) or double-diffused drain metal oxide semiconductor (DDDMOS) transistors. The HV devices can be employed as switching voltage regulators for power management applications. The HV transistors can be easily integrated into devices or ICs. The devices or ICs can be incorporated into or used with, for example, consumer electronic products, and particularly portable consumer products such as smart phones, mobile phones, tablets, TV displays and personal digital assistants (PDA).

Figure 1A:
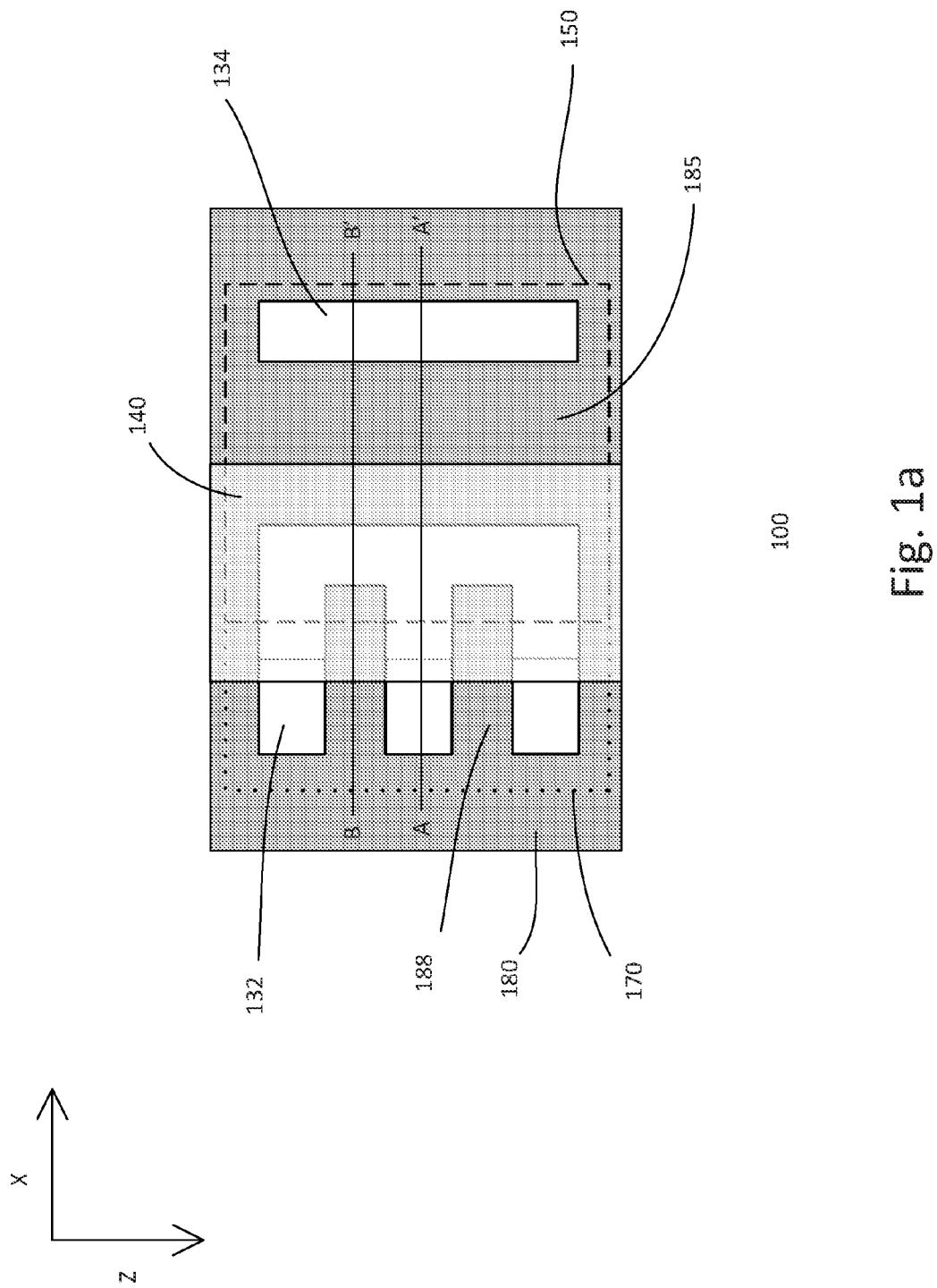
FIGS. 1*a*-1*d* show various views of an embodiment of a device. For example.
Figure 1B:
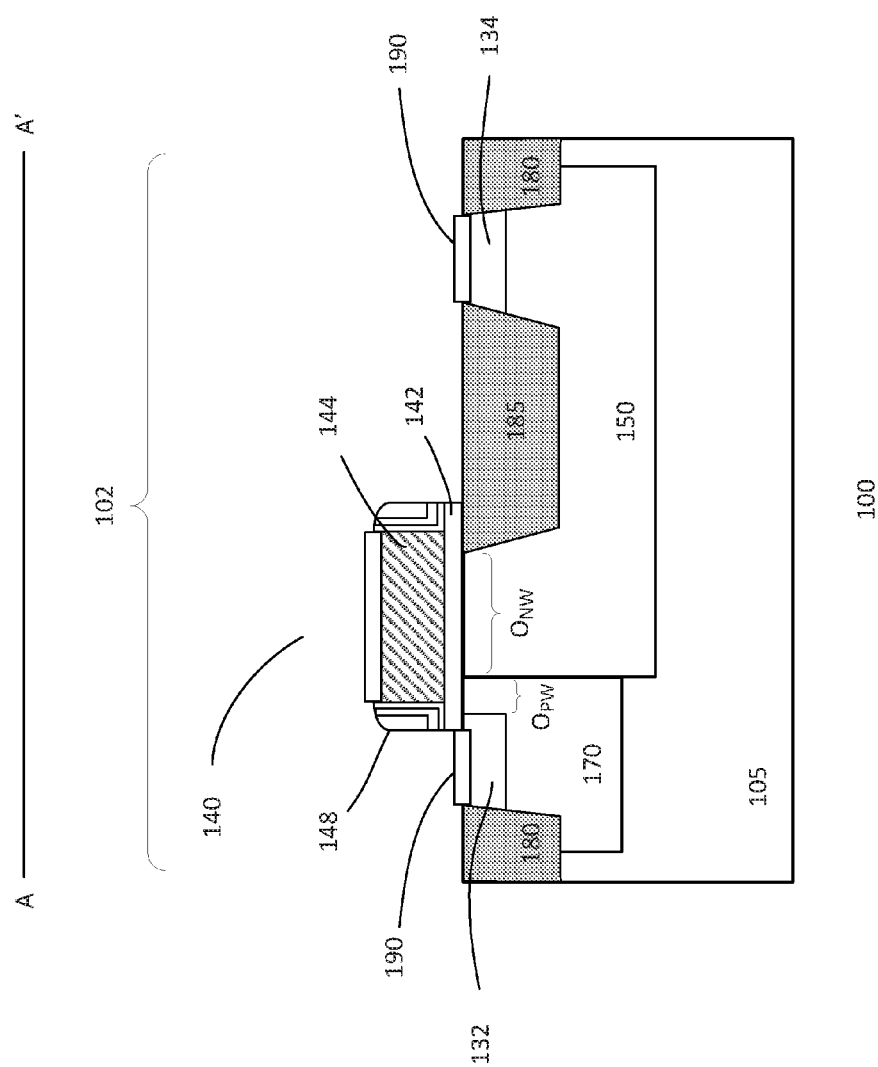
Figure 1C:
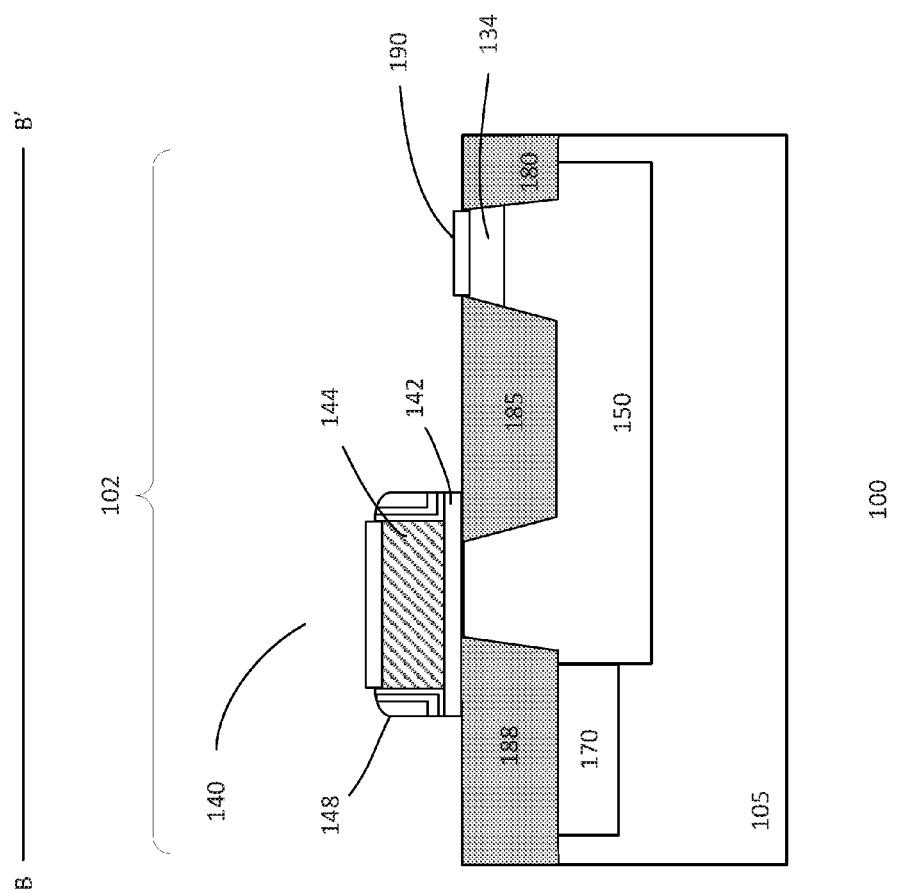
Figure 1D:
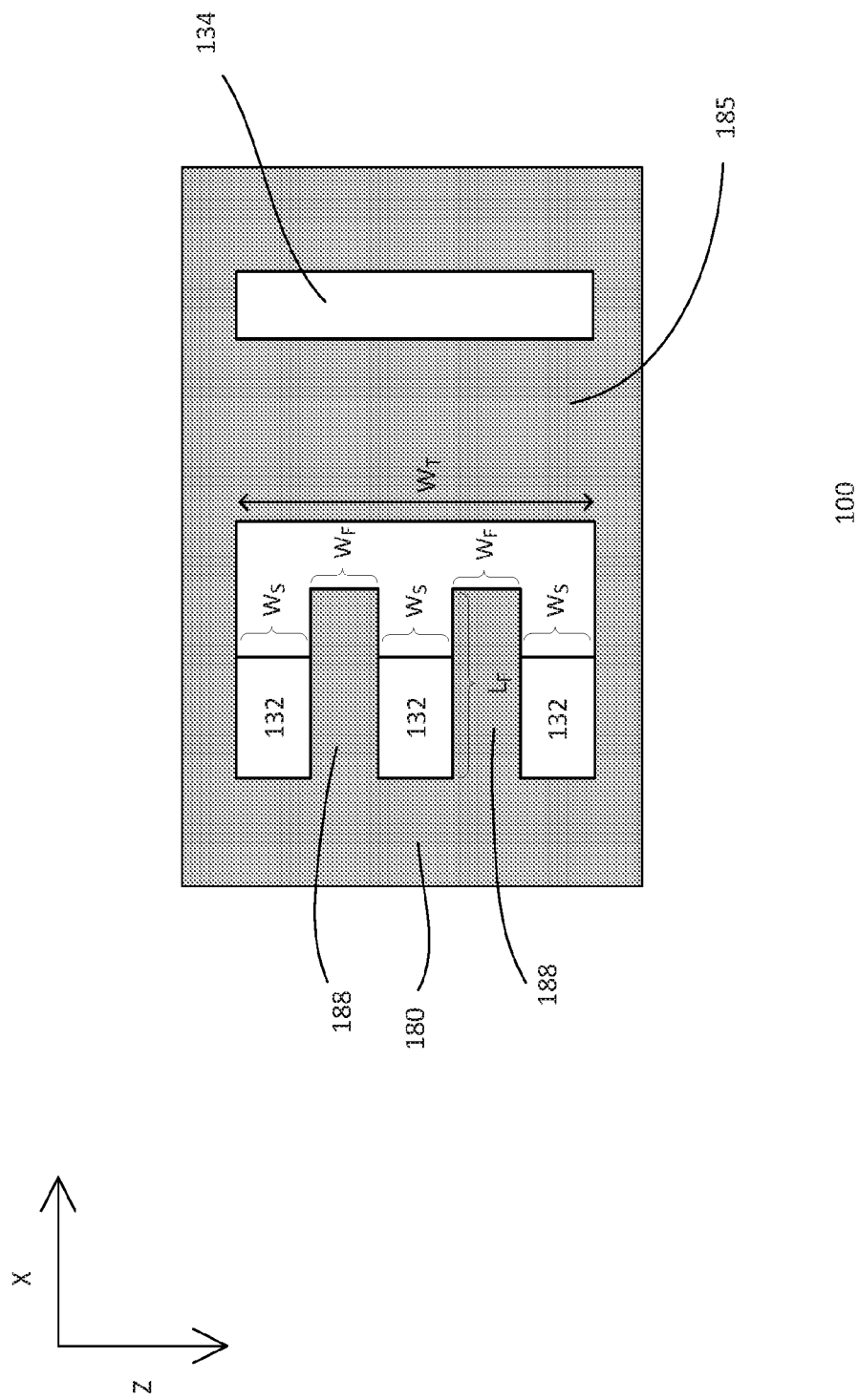

FIGS. 1*a*-1*d* show various views of an embodiment of a device 100. The device is, for example, an IC. FIG. 1*a* shows a top view of the device, FIG. 1*b* shows a cross-sectional view taken along A-A', FIG. 1c shows a cross-sectional view taken along B-B' of the device while FIG. 1d shows a simplified top view of the device.

In one embodiment, the device 100 includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. In one embodiment, the substrate is lightly doped with second polarity type dopants. For example, the second polarity type may be p-type. Providing a substrate with other types of dopants, or dopant concentrations, as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p or n. A lightly doped region may have a dopant concentration of about $1E11$-$1E13/cm^2$, and an intermediately doped region may have a dopant concentration of about $1E13$-$1E15/cm^2$, and a heavily doped region may have a dopant concentration of about $1E15$-$1E17/cm^2$. Providing other dopant concentrations for the different types of doped regions may also be useful. For example, the ranges may be varied, depending on the technology node. P-type dopants may include boron (B), aluminum (Al), indium (In), or a combination thereof, while n-type dopants may include phosphorous (P), arsenic (As), antimony (Sb), or a combination thereof.

The substrate includes a device region 102. The device region, for example, is a HV device region for a HV device, such as a HV transistor. In one embodiment, the device 100 includes a LDMOS transistor. Providing other types of devices in the device region may also be useful. The substrate may also include regions for other types of circuitry, depending on the type of device or IC. For example, the device may also include regions for intermediate voltage (IV) and low voltage (LV) devices as well as an array region for memory devices.

Isolation regions may be provided for isolating or separating different device regions of the substrate. In one embodiment, the device region 102 is isolated from other regions by a device isolation region 180. For example, the device isolation region surrounds the device region. The device region may be an active region of the device 100. In one embodiment, the device region may be provided with one or more isolation regions or structures to form active sub-regions in the device as will be described in detail later. For example, one or more isolation regions may separate different portions of the active region. The isolation region is, in one embodiment, a shallow trench isolation (STI) region. A STI region includes an isolation trench filled with isolation or dielectric materials. Other types of isolation regions may also be employed. For example, the isolation region may be a deep trench isolation (DTI) region. The STI regions, for example, extend to a depth of about 2000-5000 Å from the surface of the substrate. In the case of DTI regions, the depth may be about 1-10 µm. Providing isolation regions which extend to other depths may also be useful.

The transistor includes a gate 140 on the surface of the substrate. The gate, for example, traverses the device region along the channel width direction. The width of the gate along a channel length direction of the transistor may be about 0.1-50 µm. As shown, the channel length direction is in the x direction and the channel width direction is in the z direction. The x and z directions, for example, are orthogonal to each other. As illustrated, the gate is a gate conductor of a transistor. The gate, for example, may also be a gate conductor which forms gates of multiple transistors (not shown). For example, the gate conductor may traverse a plurality of device regions separated by isolation regions. For example, a plurality of transistors may have a common gate formed by the gate conductor. Other configurations of gate conductors may also be useful.

The gate, in one embodiment, includes a gate electrode 144 over a gate dielectric 142. The gate dielectric, for example, may be silicon oxide while the gate electrode may be polysilicon. The gate dielectric, for example, may be a HV gate dielectric having a thickness of about 50-500 Å while the gate electrode may be about 500-5000 Å thick. In some embodiments, the gate electrode may be a doped electrode. For example, the gate electrode may be polysilicon doped with transistor type dopants. For example, the transistor type dopants may be n-type for a n-type transistor or p-type for a p-type transistor. Other types of gate dielectrics and gate electrodes as well as thicknesses may also be useful. For example, the gate dielectric may be a high k gate dielectric and/or the gate electrode may be a metal gate electrode. Other configurations of gate layers of the gate may also be useful.

The transistor includes first and second diffusion regions 132 and 134 disposed within the substrate on first and second sides of the gate. For example, the first diffusion region 132 is disposed on the first side of the gate and the second diffusion region 134 is disposed on the second side of the gate. The diffusion regions, in one embodiment, are heavily doped with first polarity type dopants for a first polarity type transistor. For example, the diffusion regions are heavily doped n-type regions for a n-type transistor. Providing heavily doped p-type diffusion regions for a p-type transistor may also be useful. The first and second diffusion regions, for example, have a dopant concentration of about $1E15$-$1E17/cm^2$. Other dopant concentrations may also be useful. The diffusion regions include a depth from the substrate surface. In one embodiment, the diffusion regions 132 and 134 have a depth shallower than the depth of the STI regions 180. The depth of the diffusion regions, for example, may be about 0.1-0.4 µm. Providing diffusion regions having other depth dimensions may also be useful. Additionally, it is not necessary that the first and second diffusion regions have the same depth.

In one embodiment, the first and second diffusion regions may serve as source and drain (S/D) regions of the transistor. For example, the first diffusion region 132 may serve as the source region and the second diffusion region 134 may serve as the drain region. Other configurations of S/D regions may also be useful. A channel region of the transistor is located in the substrate under the gate and between the S/D regions. In one embodiment, the source region 132 is adjacent to the first side of the gate and underlaps a portion of the gate dielectric. The underlap portion should be sufficient for the source region to be in communication with the channel region under the gate. For example, the source region may underlap the gate dielectric by about 0.1-0.3 µm. A source region which underlaps the gate dielectric by other amounts may also be useful. In one embodiment, the portion of the source region which underlaps the gate dielectric may be a S/D extension region (not shown). The S/D extension region is, for example, a lightly doped source (LDS) region extending beyond the source region to underlap a portion of the transistor gate 140. The LDS region may include first polarity type dopants for a first polarity type transistor. Other configurations of region may also be useful. In some cases, the S/D extension region may include a halo region extending beyond the LDS region and underlapping the gate. The halo region may be a second polarity type doped region for a first polarity type transistor. Other configurations of S/D extension region and halo region may also be useful.

Sidewalls of the gate 140 may be provided with dielectric spacers 148. The dielectric spacers, for example, may be silicon oxide spacers. Other types of dielectric materials may also be useful, such as silicon nitride or a combination of dielectric materials or layers. For example, the spacers may be composite spacers. The spacers may include an offset spacer and main spacer. The offset spacer may facilitate forming the LDS region while the main spacers facilitate forming heavily doped S/D regions. Other configurations of spacers may also be useful. For example, the spacer may be a single spacer.

In one embodiment, an internal isolation region 185 is provided within the device region. The internal isolation region may be a STI region or structure. Other types of isolation region may also be useful. Preferably, the internal isolation region 185 is the same type of isolation region as the device isolation region 180. Providing an internal isolation region which is different from the device isolation region may also be useful. The internal isolation region, for example, is disposed in the device region between the gate 140 and the drain region 134. The internal isolation region, for example, extends from one side to the other side of the device region along the channel width direction (or z direction) as shown in FIGS. 1a and 1d. Other configurations of the device and internal isolation regions may also be useful. Referring to FIGS. 1b and 1c, the internal isolation region displaces the drain region from a second side of the gate and extends under the gate. For example, the internal isolation region underlaps the second side of the gate by about 0.1-2 μm. Providing an internal isolation region which underlaps the second side of the gate by other dimensions may also be useful. Providing an internal isolation region which underlaps the gate protects the edge of the gate dielectric from high electric field during operation. The width of the internal isolation region measured along the channel length direction, for example, may be about 0.1-50 μm. Other widths may also be useful, depending on the drain voltage of a technology node. The width and depth of the internal isolation region may determine a drift distance of the transistor.

A first device well 150 is disposed in the substrate within the device region. The first device well serves as a drift region or well. For example, the drift well is disposed adjacent to the second side of the gate 140 and underlaps a portion of the gate. As shown in FIGS. 1b-1c, the drift well encompasses the drain region 134 and the internal device isolation region 185. The drift well includes first polarity type dopants for a first polarity type transistor. For example, the first device well (or first well) includes n-type dopants for a n-type transistor or p-type dopants for a p-type transistor. The dopant concentration of the first well may be lower than the dopant concentration of the drain region. In one embodiment, the first well may be lightly or intermediately doped with n-type dopants. For example, the dopant concentration of the first well is about $1E12$-$1E13/cm^2$. Other dopant concentrations may also be useful. The dopant concentration, for example, may depend on the maximum or breakdown voltage requirement of the device.

The drift region connects the drain region to the channel region of the transistor. The gate overlaps the drift region, creating a gate overlap region $O_{NW}$ in the drift region. In one embodiment, the $O_{NW}$ is between an inner edge of the drift region under the gate and an inner edge of the internal isolation region 185 under the gate. The gate overlap region should be sufficiently wide to provide the desired $R_{dson}$ resistance and drive current. In one embodiment, $O_{NW}$ is about 0.1-2 μm. Providing other values of $O_{NW}$ may also be useful. The width of $O_{NW}$, for example, may depend on design requirements.

In one embodiment, the drift region includes a depth from the substrate surface. For example, the drift region extends from the substrate surface to a depth deeper than the internal isolation region. The depth of the drift region may be about 0.5-5 μm. Other depth dimensions may also be useful. The depth, for example, may depend on the design voltage of the device. The substrate portion under the gate disposed between the source region 132 and drift region forms a channel region of the transistor.

The distance from the drain region and around the internal isolation region to the channel region under the gate may determine a drift distance or drift length of the transistor. In one embodiment, the drift distance of the transistor correlates to the $R_{dson}$ of the device. For example, reducing the drift distance also reduces the $R_{dson}$ of the device.

A second device well 170 is disposed in the substrate within the device region. For example, the second device well is disposed adjacent to the first side of the gate 140 and underlaps a portion of the gate. The second device well (or second well) serves as a body of the transistor between the source region and drift region. As shown in FIG. 1b, the second device well encompasses the source region 132. The second device well includes second polarity type dopants for a first polarity type transistor. For example, the second device well includes p-type dopants for a n-type transistor or n-type dopants for a p-type transistor. The dopant concentration of the second device well may be lower than the dopant concentration of the source region. In one embodiment, the second device well is lightly to intermediately doped with p-type dopants. For example, the dopant concentration of the second device well may be about $1E12$-$1E14/cm^2$. Other dopant concentrations may also be useful.

The second well 170, in one embodiment, includes a depth deeper than the internal isolation region. The depth of the second well may be about 0.5-10 μm. Other suitable depth dimensions may also be useful. Although the depth of the second well is illustrated as shallower than the depth of the drift region 150, it is to be understood that the depth of the second well may be the same as or deeper than the drift region.

In one embodiment, the second well 170 may extend along the channel length direction (or x direction) to about the inner edge of the drift region 150. For example, the inner edge of the second well may be contiguous with the inner edge of the drift well. Other configurations of second well and drift region may also be useful. Although the first and second wells are shown to be contiguous, it is to be understood that the second well may also extend to encompass the first well. For example, the second well may extend beyond the first well and include a depth deeper than the first well.

As shown, the second well extends under a portion of the gate. For example, the second well extends beyond the source region and underlaps the first side of the gate, creating a gate overlap region $O_{PW}$ in the second well. In one embodiment, the $O_{PW}$ is between the inner edge of the source region under the gate dielectric 142 and the inner edge of the drift region under the gate. The gate overlap region should be sufficiently wide to provide the desired channel length. For example, the length of the gate overlap region $O_{PW}$ forms the length of the channel region. In one embodiment, $O_{PW}$ is about 0.1-10 µm. Providing other values of $O_{PW}$ may also be useful. The length of $O_{PW}$, for example, may depend on design requirements.

As described, the device region includes device isolation region 180 surrounding the active region and internal isolation region 185 disposed between the gate and drain region. The device and internal isolation regions 180 and 185 include STI regions or structures. Other suitable types of isolation structure, such as DTI, may also be useful. In one embodiment, the portion of the device region adjacent to the first side (or source side) of the gate includes one or more isolation extensions or slots/fingers 188, forming one or more inactive regions disposed within the active region and adjacent to the first side of the gate. As shown in at least FIGS. 1*a* and 1*d*, the LDMOS device includes one or more isolation extensions or slots/fingers 188 which extend from a portion of the device isolation region adjacent to the source side of the gate and traverse the source and channel regions and have edges adjacent to edges of the source region. This results in discontinuous portions of active source and channel regions. For example, the one or more isolation fingers 188 segregate the active source and channel regions into active sub-regions.

The one or more isolation fingers may have a general geometric shape, such as a rectangular shape when viewed from top as shown in FIGS. 1*a* and 1*d*. Other configurations of the isolation fingers may also be useful. The isolation fingers, as shown, are symmetrical and distributed uniformly along the source and channel regions. For example, each of the isolation fingers is about the same size. The one or more isolation fingers have a width ($W_F$) measured along the channel width direction (or z direction) and a length ($L_F$) measured along channel length direction (or x direction). As described, the length $L_F$ includes any suitable dimensions as long as it sufficiently overlaps the second well and slightly extends into the drift region. In one embodiment, the isolation fingers 188 extend along the channel length direction to underlap a portion of the gate as shown in FIGS. 1*a* and 1*c*. In one embodiment, the one or more isolation fingers overlap the second well 170 and extend partially into the drift region. For example, the isolation fingers extend sufficiently into the drift region to isolate the active sub-regions of the channel region and to ensure that these portions of the channel region are cut-off without increasing drift region resistance. The isolation fingers may extend a sufficient distance into the drift region. For example, each of the isolation fingers extends a length of at least about 0.01-0.1 µm into the drift region along the channel length direction. Other suitable lengths of extension into the drift region may also be useful. As shown, a portion of the drift region underlapping the gate separates the isolation fingers from the internal isolation region 185. Other configurations of isolation fingers and drift region may also be useful.

As described, the isolation fingers are distributed uniformly along the source and channel regions. In one embodiment, the number and distribution of the isolation fingers in the device region may be based on a ratio to achieve a desired number of carriers entering into the drift region. For example, the ratio may be defined by the width of an active source sub-region ($W_S$) and the width of the isolation finger ($W_F$) measured along the channel width direction as shown in FIG. 1*d*. In one embodiment, the ratio of $W_S:W_F$ may be about 2:1. For example, $W_S$ may be about 2 µm and $W_F$ may be about 1 µm. Other suitable ratios, such as but not limited to 4:1 or 3:2, may also be useful. Thus, any suitable lengths of $W_S$ and $W_F$ may be used to satisfy the ratio. For illustration purpose, the LDMOS includes 2 isolation fingers disposed adjacent to the source side, forming a multi-fingered isolation structure as shown in FIGS. 1*a* and 1*d*. Other suitable number of isolation fingers and/or distribution ratio may also be useful as long as there is sufficient and uniform distribution of carriers entering into the drift region. The number of isolation fingers and the ratio, for example, may also depend on the total width ($W_T$) of the transistor and technology node.

As shown in FIGS. 1*c*-1*d*, the isolation fingers 188 are STI structures. In one embodiment, the one or more isolation fingers disposed adjacent to the first (or source) side of the gate are formed by modifying a layout of the trenches during formation of the device isolation region 180 and internal isolation region 185 in the substrate. For example, the one or more isolation fingers are formed by altering the layout of forming the STI trenches. Thus, the isolation trenches corresponding to the isolation extensions or slots/fingers are also filled with isolation or dielectric materials, the same as that used for forming the device and internal isolation regions 180 and 185. In such case, the isolation fingers include the same material and the same depth as the device and internal isolation regions. In other embodiments, a different mask may be used to define the one or more isolation fingers. This may form isolation fingers having different depth than that of the device and internal isolation regions.

Salicide contacts 190 may be formed on the gate electrode of the gate and source and drain regions. The salicide contacts, for example, may be nickel-based contacts. Other types of metal silicide contacts may also be useful. For example, the salicide contact may be cobalt silicide (CoSi). The salicide contacts may be about 50-300 Å thick. Other thickness of salicide contacts may also be useful. The salicide contacts may be employed to reduce contact resistance and facilitate contact to the back-end-of-line metal interconnects (not shown) disposed in inter level dielectric (ILD) layers (not shown) disposed over the substrate.

Figure 2B:
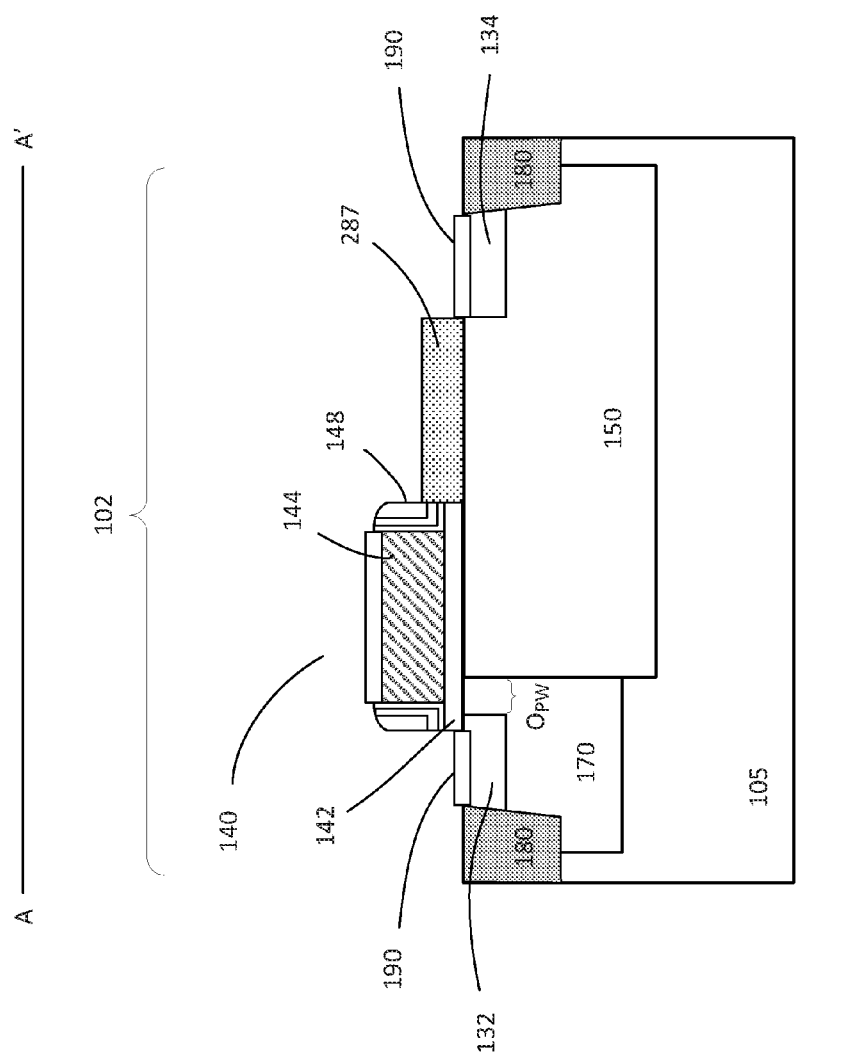
Figure 2C:
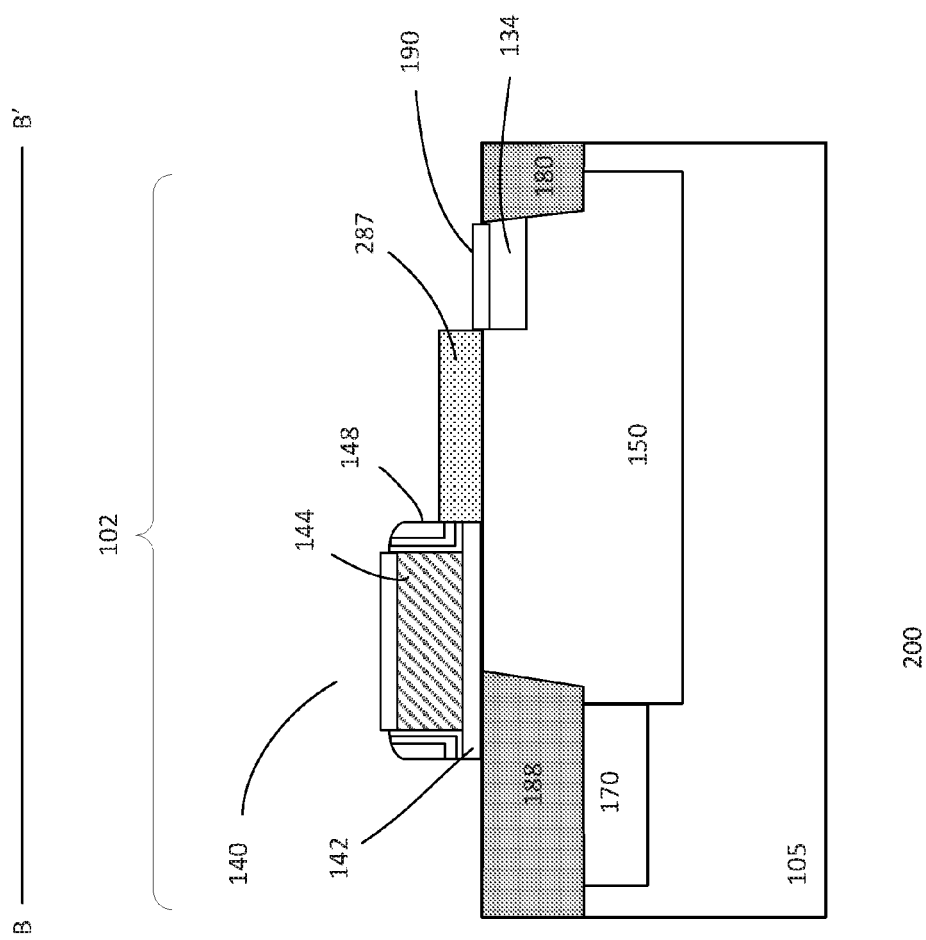
Figure 2D:
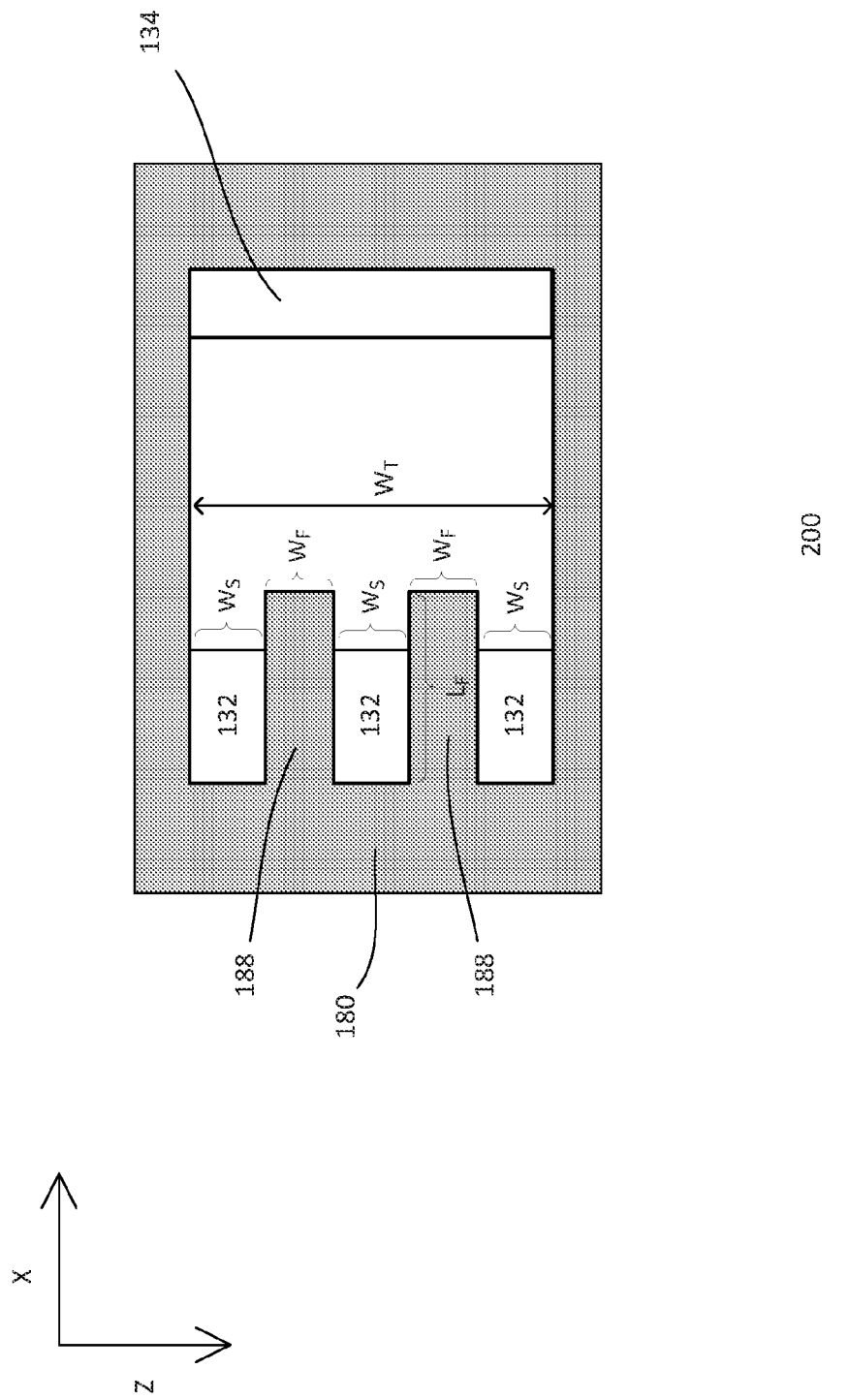

FIGS. 2*a*-2*d* show various views of another embodiment of a device 200. The device is, for example, an IC. FIG. 2*a* shows a top view of the device, FIG. 2*b* shows a cross-sectional view taken along A-A', FIG. 2*c* shows a cross-sectional view taken along B-B' of the device while FIG. 2*d* shows a simplified top view of the device. The device 200 is similar to that described in FIGS. 1*a*-1*d*. Common elements and features having the same reference numerals may not be described or described in detail. In the interest of brevity, the description of the device 200 below primarily focuses on the difference(s) compared with the device 100 shown in FIGS. 1*a*-1*d*.

As shown, the device 200 includes a substrate 105 having a device region 102 surrounded by a device isolation region 180. The device region, for example, is a HV device region for a HV transistor. In one embodiment, the device includes a double-diffused drain metal oxide semiconductor (DDDMOS) transistor. Providing other types of HV devices in the device region may also be useful. The substrate may also include regions for other types of circuitry, depending on the type of device or IC. For example, the device may also include regions for IV and LV devices as well as an array region for memory devices.

In one embodiment, no internal isolation region is provided within the device region. For example, as shown in FIGS. 2*a*-2*d*, the transistor is not provided with an internal isolation region in the first device well 150. In the case where no internal isolation region is provided, a salicide block 287 may be disposed on the substrate over the drift region. The salicide block is, for example, disposed along the z direction between the gate and the drain region. Other configurations of the salicide block may also be useful. As shown, the salicide block displaces the drain region a distance from the second side (or drain side) of the gate. For example, the width of the salicide block may be about 0.5-5 µm. Other widths of salicide block may also be useful. The salicide block may be formed to increase the distance between the drain region and the gate.

In one embodiment, the salicide block 287 may be aligned with the gate and drain region. For example, the salicide block may be aligned with the edge of the sidewall spacer and the inner edge of the drain region. Other configurations of salicide block may also be useful. For example, the salicide block may also slightly overlap the gate and drain region. The salicide block, for example, is formed from a material of which silicidation does not occur. In one embodiment, the salicide block is formed of a dielectric material. The dielectric material, for example, may be oxide, nitride, oxynitride or a combination thereof. Other types of dielectric materials, such as those compatible for semiconductor processing, may also be useful. The salicide block may be about 100-1000 Å thick. Other suitable thickness dimensions may also be useful.

Providing a salicide block also prevents silicidation of the substrate between the gate and drain region. This, for example, provides a high resistance drift region to sustain high voltage applied to the drain. Silicidation is subsequently performed to provide silicide contacts over the exposed contact regions of the transistor, such as the transistor gate and source and drain regions. The salicide block may either be subsequently removed or remain after formation of the salicide contacts.

The embodiments as described in FIGS. 1a-1d and FIGS. 2a-2d result in various advantages. For example, providing one or more isolation extensions or slots/fingers adjacent to the source side of the gate cuts off a portion of the device region adjacent to the source side of the gate. The one or more isolation extensions or slots/fingers, for example, reduce some of the active area of the source and channel regions. For example, the one or more isolation fingers segregate the source region into sub-regions such that the total active area of the source region is reduced. Moreover, the isolation fingers sufficiently overlap the second well or body of the transistor and extends slightly into the drift region. Such configurations of the isolation fingers completely turn off these portions of the channel region, lowering the total drive current and the amount of carriers available in the active area of the source sub-regions. Thus, this effectively reduces the number of carriers entering into the high electric field region (e.g., area of the drift region between the inner edge of the internal isolatic region and the second side of the gate or the area of the drift region between the outer edge of the internal isolation region and the inner edge of the drain region adjacent to the internal isolation region) during operation of the transistor. The reduction of the number of carriers lessens impact ionization which would otherwise generate hot carriers to degrade reliability of the gate oxide. With reduced impact ionization and total drive current, both the drift length of the drift region and device pitch can be reduced, further lowering $R_{dson}$ without compromising device reliability. For example, the width of the internal isolation region or the salicide block along the channel length direction can be reduced, thereby shrinking the drift length and device pitch without affecting the reliability of the device. Furthermore, the device architecture as described is flexible and is compatible with n and p type MOS devices such as n and p type LDMOS and DDDMOS.

FIGS. 3a-3g show cross-sectional views of an embodiment of a process 300 for forming a device. The device is, for example, an IC. Other types of devices may also be useful. The device formed by process 300 is similar or the same as that shown in FIGS. 1a-1d. As such, in the interest of brevity, common elements and features having the same reference numerals may not be described or described in detail.

Figure 3A:
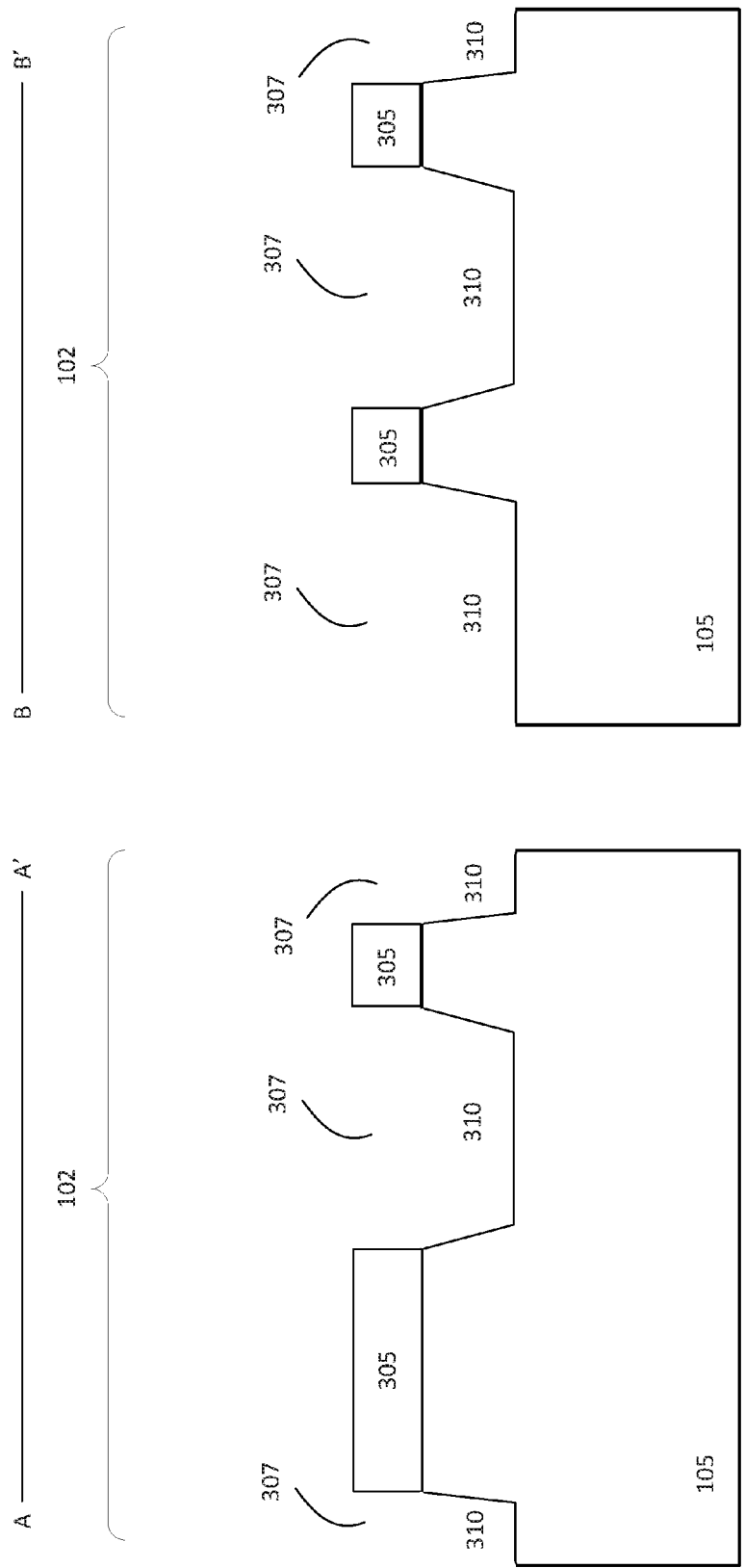
FIGS. 3*a*-3*g* show cross-sectional views of an embodiment of a process for forming a device.

Referring to FIG. 3a, a substrate 105 is provided. The substrate can include a silicon substrate, such as lightly doped p-type or n-type substrate. Other types of substrates, including silicon germanium, germanium, gallium arsenide, or SOI, are also useful. Providing a substrate with other types of dopants or dopant concentrations as well as an undoped substrate, may also be useful.

The substrate 105 is prepared with a device region 102 and various isolation regions. The device region, in one embodiment, serves as a device region for a HV transistor, such as a LDMOS transistor. Although one device region is shown, the substrate may also include other regions (not shown) for other types of circuitry, depending on the type of device or IC. A device isolation region 180 surrounds the device region. The device isolatic region, for example, isolates the device region from other regions.

In one embodiment, forming the device isolation region may also form the internal isolation region 185 and one or more isolation slots/fingers 188. For example, the different isolation regions may be formed simultaneously having the same depth from the substrate surface. Alternatively, the different isolation regions may be formed in separate process steps. In such cases, the different isolation regions may be formed with different depths from the substrate surface. The isolation regions are, for example, STI regions. Other suitable types of isolation regions, such as DTI regions, may also be useful.

Various processes can be employed to form the STI regions with configuration as shown and as described in FIGS. 1a-1d above. In one embodiment, the substrate is patterned to form trenches 310 corresponding to locations where the various isolation regions are to be formed. The substrate, in one embodiment, is patterned to form device isolation trench corresponding to the device isolation region, one or more isolation finger trenches corresponding to the one or more isolation fingers and internal isolation trench corresponding to the internal isolation region. For example, the device isolation trench surrounds the device region while the internal isolation trench is defined in between the gate and drain region which will be formed later. The one or more isolation finger trenches, for example, extend from a portion of the device isolation trench adjacent to the source side of the gate. The trenches corresponding to the isolation fingers, in one embodiment, are elongated isolation trenches disposed along the channel length direction (or x direction). Other types of trenches may also be useful. Patterning the isolation trenches may be achieved by mask and etch techniques. For example, a mask 305 such as a photoresist or soft mask, may be provided on the substrate and exposed with an exposure source using a reticle with the desired pattern. The exposed mask is developed, transferring the layout or pattern of the reticle to the mask. For example, the patterned mask includes a layout having openings 307 corresponding to locations where the trenches are to be formed. An anisotropic etch, such as reactive ion etch (RIE), is performed using the patterned mask to form the isolation trenches in the substrate.

Figure 3B:
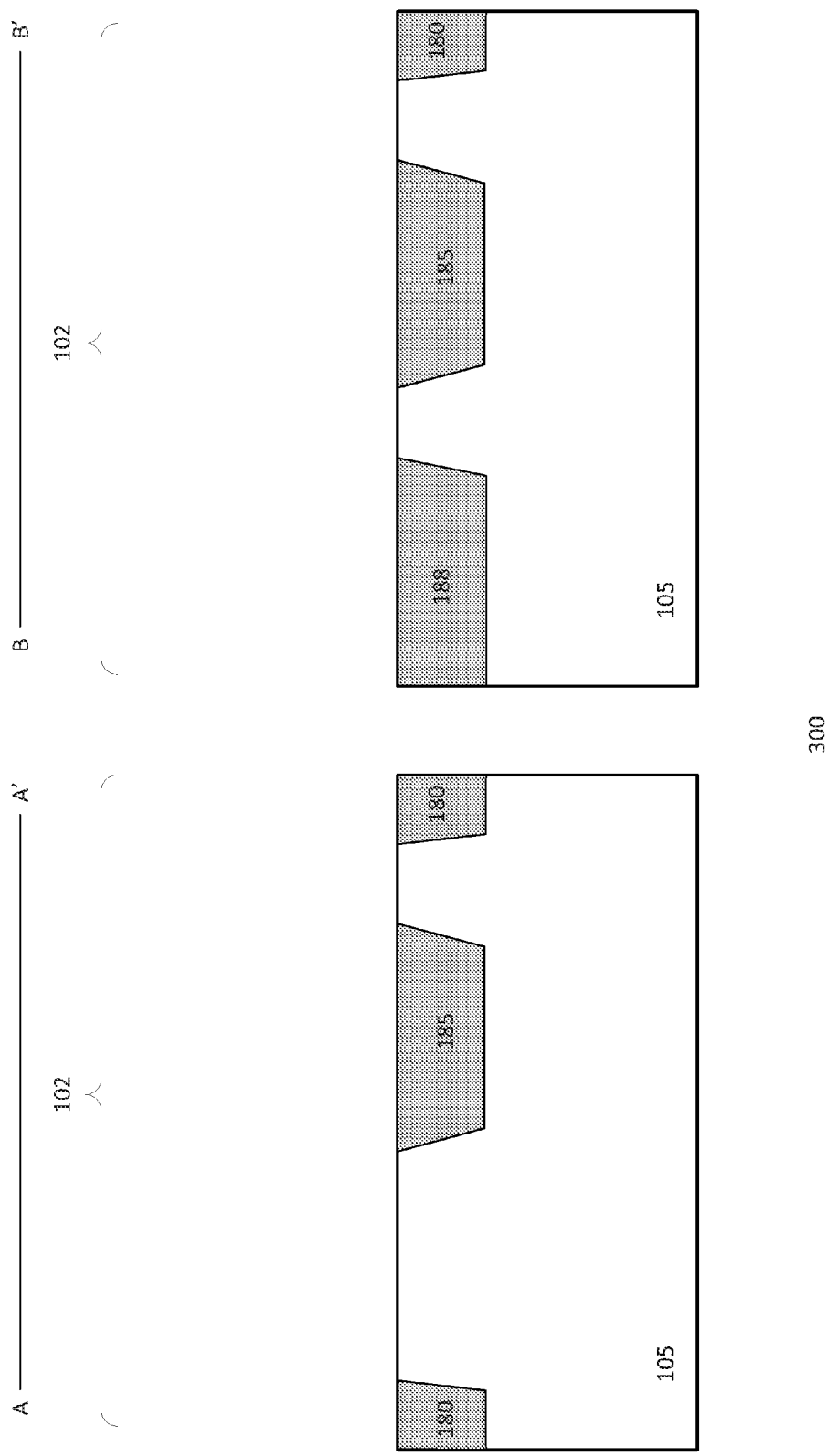

The trenches are then filled with dielectric materials such as silicon oxide. Chemical mechanical polishing (CMP) can be performed to remove excess oxide and provide a substantially planar top surface, as shown in FIG. 3b. Other suitable processes or materials can also be used to form the STI regions 180, 185 and 188.

Figure 3C:

Referring to FIG. 3c, first and second device wells 150 and 170 are formed in the device region. The device wells may be formed by ion implantations. It is to be understood that separate implants may be performed using separate masks to expose different portions of the device region to form different polarity type of wells. In one embodiment, a first implant mask is used to form the first (or drift) well 150 and a second implant mask is used to form the second well 170. For example, the first well includes first type dopants for a first polarity type transistor and the second well includes second type dopants for a first polarity type transistor.

To form each of the wells, an implant mask (not shown) which exposes a portion of the device region is used. The implant mask, for example, is a photoresist layer patterned by a lithographic mask. The implant introduces dopants into the substrate exposed by the implant mask. The dopants are implanted with the appropriate dose and power to form each of the wells having the desired depth and dopant concentration. An implant mask may also expose other device regions for the same polarity type of wells (not shown).

Figure 3D:
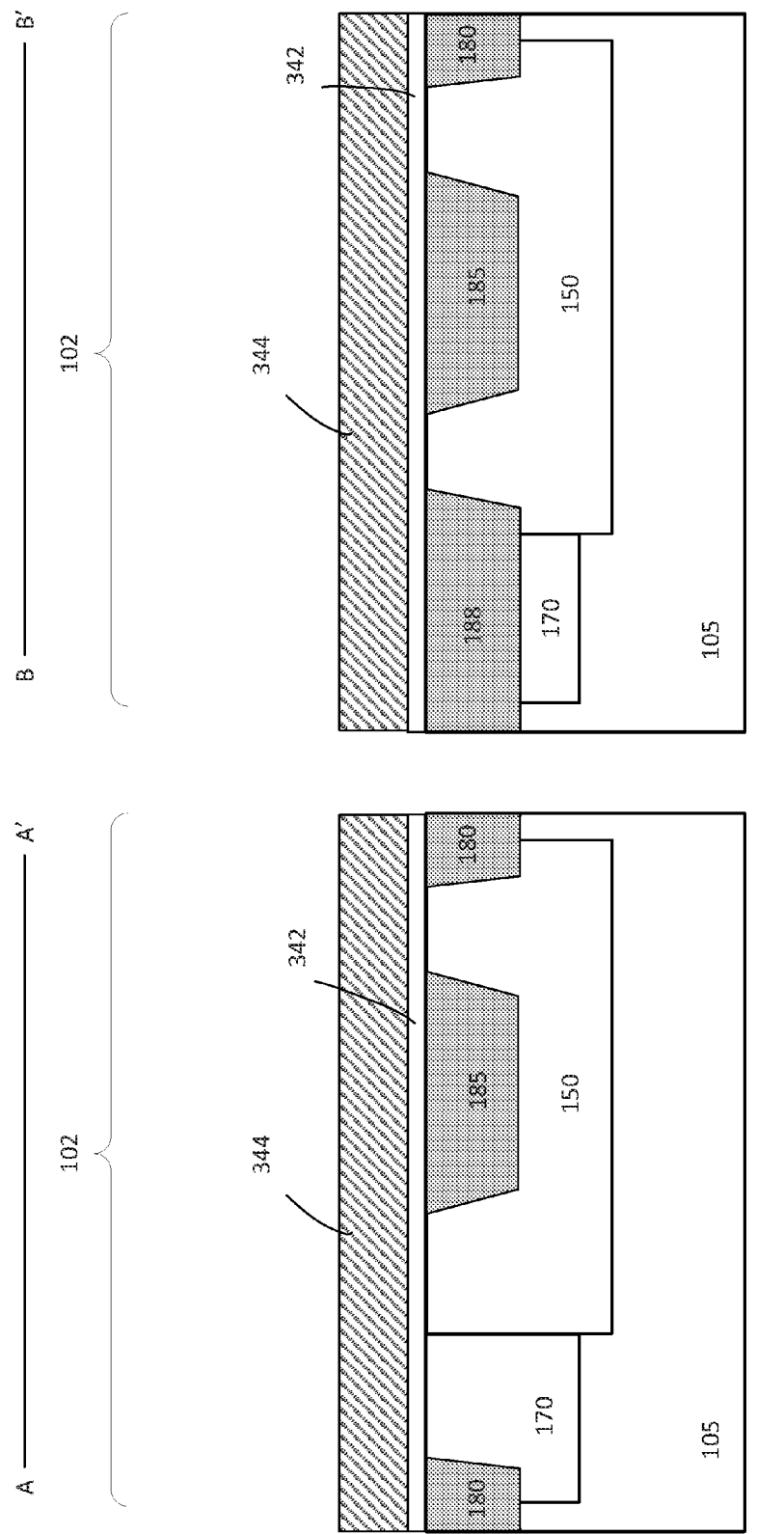

Referring to FIG. 3d, the process continues to form gate layers. In one embodiment, the gate layers include a gate dielectric layer 342 on the substrate and a gate electrode layer 344 formed thereon. The gate dielectric layer, for example, is a silicon oxide layer. The gate dielectric layer may be formed by thermal oxidation. The gate dielectric layer, for example, may be a thick gate dielectric layer having a thickness of about 50-500 Å. Other types of gate dielectric materials, thickness dimensions and forming techniques may also be useful. For example, the gate dielectric layer may be formed by other suitable types of processes, such as chemical vapor deposition (CVD), high temperature oxidation (HTO) process or in-situ steam generation (ISSG) process.

A gate electrode layer 344 may be deposited on the gate dielectric layer 342. The gate electrode layer, for example, includes polysilicon. Other suitable types of gate electrode materials may also be useful. The thickness of the gate electrode layer may be about 500-5000 Å. Other thicknesses may also be useful. Furthermore, the gate electrode may be doped with dopants, such as transistor type dopants. Doping the gate electrode with other dopant types may also be useful. The gate electrode layer may be formed by, for example, CVD. The gate electrode layer can be formed as an amorphous or non-amorphous layer. In the case of an amorphous layer, subsequent thermal processes may crystallize the amorphous layer to form a polycrystalline silicon gate electrode layer. Other configurations of gate dielectric and gate electrode layers may also be useful.

In one embodiment, the gate electrode layer 344 is polysilicon doped with first type dopants for a first type transistor. For example, the concentration of dopants in the gate electrode layer may be at least about $1E15/cm^2$. Various techniques may be employed to dope the gate electrode layer, for example, in-situ doping or ion implantation.

Figure 3E:
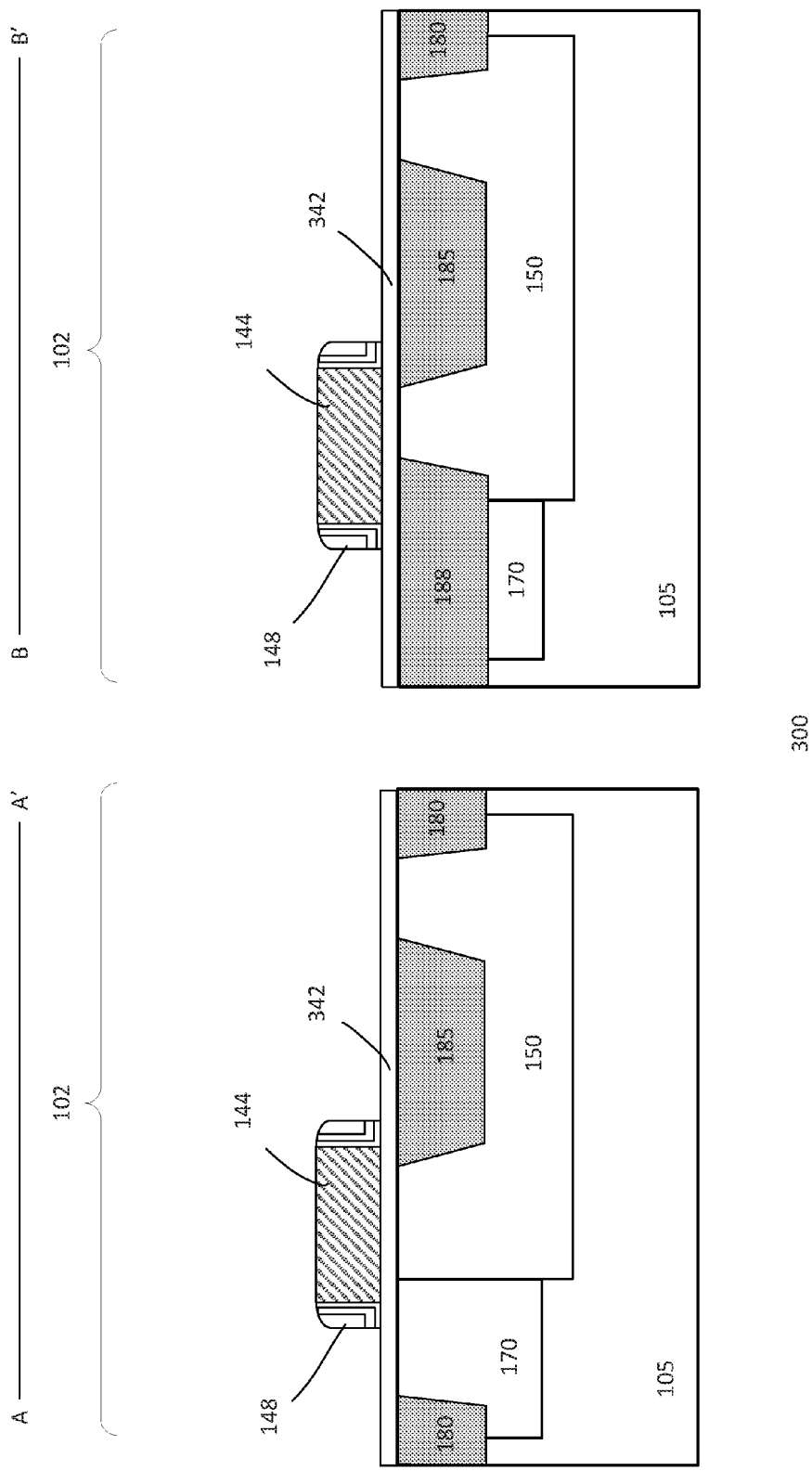

Referring to FIG. 3e, the gate electrode layer 344 is patterned to form an upper portion of the transistor gate 140. For example, the gate electrode layer is patterned to define the gate electrode of a HV gate. A patterned first mask (not shown) may be employed to pattern the gate electrode layer. For example, a soft mask layer, such as a photoresist layer, may be used. The first mask may be patterned to form openings corresponding to the locations where the gate electrode layer is to be removed. To improve lithographic resolution, an anti-reflective coating (ARC) may be used below the soft mask layer.

In other embodiments, the patterned first mask may be a hard mask layer. The hard mask layer, for example, may include TEOS or silicon nitride. Other types of hard mask materials may also be used. The hard mask layer may be patterned using a soft mask, such as a photoresist.

An anisotropic etch, such as RIE, is performed using the first mask to pattern the gate electrode layer. Other suitable types of mask and/or etch processes may also be useful. The gate electrode, for example, may be a gate electrode conductor. Other configurations of the gate electrode may also be useful.

After patterning the gate electrode layer, the process continues to form sidewall spacers on sidewalls of the gate electrode. To form the sidewall spacers, a dielectric layer is deposited over the gate layers. The dielectric layer, for example, may be silicon oxide. Other types of dielectric material, such as silicon nitride, may also be used. The dielectric layer may be formed by CVD. The dielectric layer may also be formed using other techniques. The thickness of the dielectric layer may be, for example, 300-1000 Å. Other thicknesses for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate electrode. In some applications, the spacer may be formed from multiple dielectric layers.

Figure 3F:
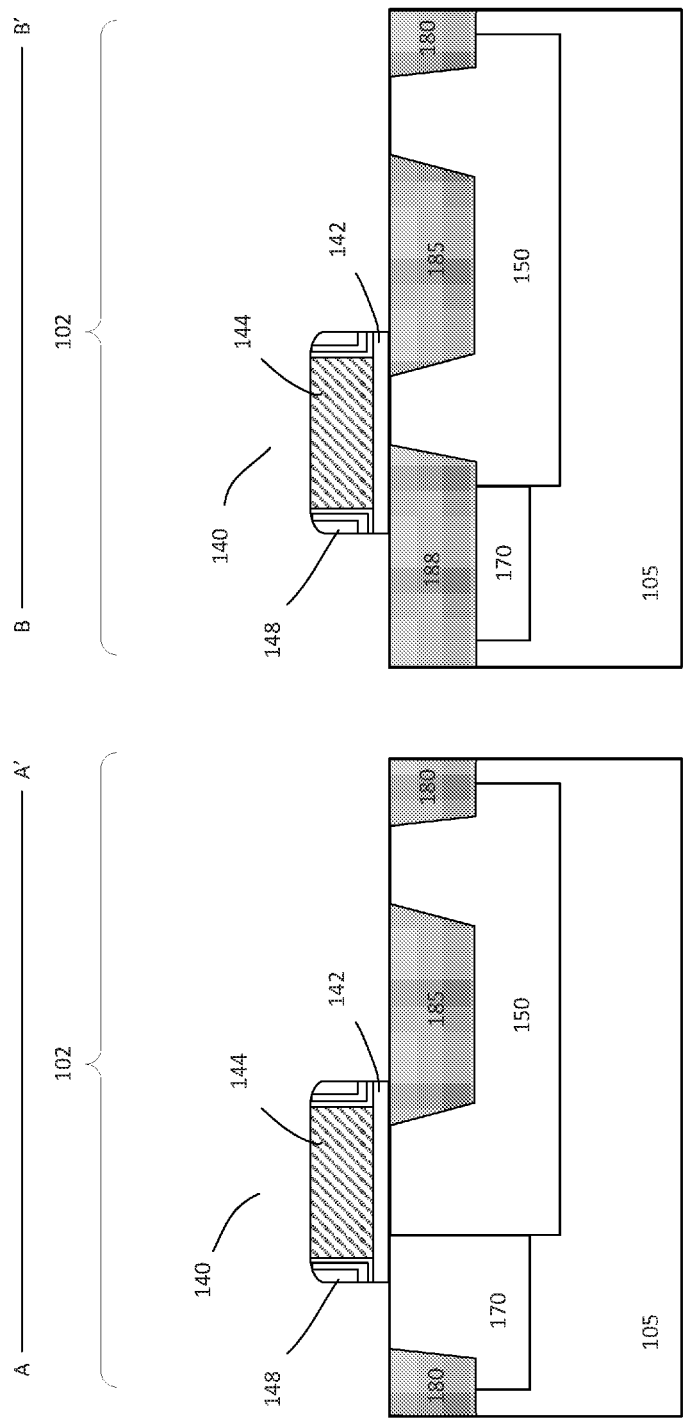

Referring to FIG. 3f, portions of the gate dielectric layer is removed. In one embodiment, a wet clean process may be employed to remove excess gate dielectric material not covered by the gate electrode. The wet clean process, for example, includes a wet etchant such as dilute hydrofluoric acid (DHF). Other suitable techniques may also be employed. This completes formation of the gate of the transistor. The gate 140, in one embodiment, overlaps a portion of the drift well 150 and second well 170 while the one or more isolation fingers underlap the gate and extend slightly into the drift well without affecting the resistance of the drift well.

Figure 3G:
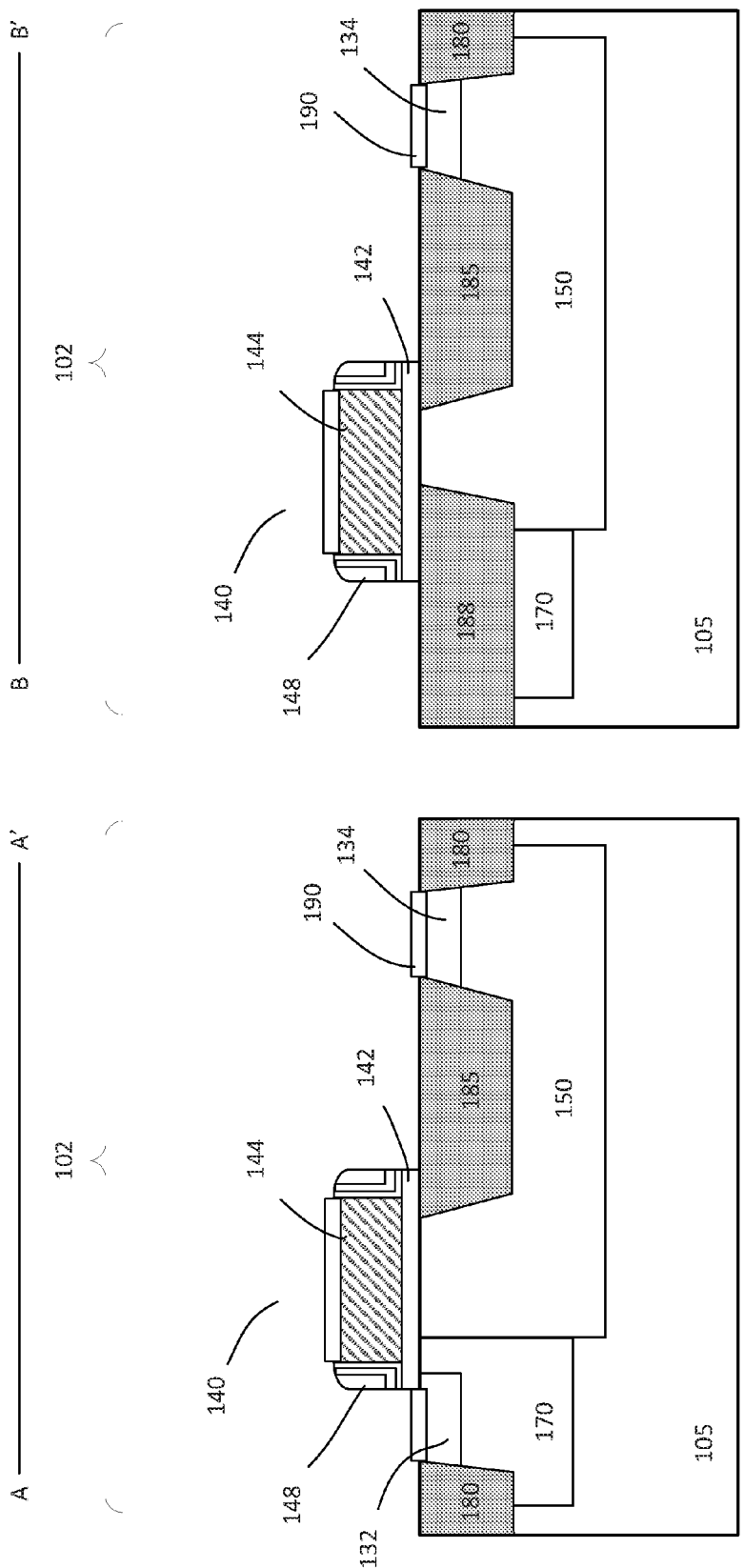

Referring to FIG. 3g, a lightly doped region (not shown) may be formed in the source region. The lightly doped region includes transistor type dopants. The lightly doped region is, for example, a LDS region. To form the lightly doped region, transistor type dopants are implanted into the substrate. The implant, for example, may be self-aligned with respect to the device region. For example, the dopants may be introduced into the substrate unprotected by the transistor gate 140 and isolation region 180. The lightly doped region may be a shallow LDS region. In one embodiment, the lightly doped region underlaps the gate. For example, dopant diffusion due to subsequent thermal processes, such as rapid thermal annealing (RTA) to activate the dopants, extends the LDS region under the gate.

In alternative embodiments, an implant mask may protect the second or drain region 134 while exposing the first or source region 132. This allows the source region to be lightly doped by the implant while leaving the drain region undoped. The internal isolation region 185 may improve process window. For example, the implant mask may protect the drain region and extend to cover a part of the internal isolation region.

First and second diffusion regions 132 and 134 are formed in the substrate. The first and second diffusion regions form the source and drain regions. The diffusion regions include transistor type dopants. In one embodiment, the diffusion regions are formed by ion implantation. The implant, like the one that forms the LDS region, is self-aligned with respect to the device region. In one embodiment, the implant is used to introduce dopants into the substrate portions unprotected by the gate, spacers and isolation regions. For example, the internal isolation region displaces the drain region away from a drain side of the gate while the isolation fingers segregate the source region. Suitable implant parameters are selected to form the heavily doped diffusion regions 132 and 134, depending on implant species and junction requirements. Furthermore, dopants from the implant should not penetrate the gate electrode. An anneal is performed to diffuse and activate the dopants.

The process continues to form the device 100 as shown in FIGS. 1a-1d. For example, the process may continue to form metal salicide contacts 190. As shown, salicide contacts are formed on the contact regions, such as S/D regions and gate, of the transistor. The salicide contacts are used to reduce contact resistance and facilitate contact to the back-end-of-line metal interconnects. In one embodiment, the thickness of the salicide contacts is about 50-300 Å. Providing other thicknesses may also be useful. To form the salicide contacts, a metal layer is deposited on the substrate. The metal layer, for example, may be cobalt or an alloy thereof. Other types of metallic layers, such as nickel, or alloys thereof, may also be used. The metal layer can be formed by physical vapor deposition (PVD). Other types of metal layers that can be formed by other types of processes can also be used.

A first anneal may be performed. The first anneal diffuses the metal dopants into the active substrate, forming a silicide layer. Excess metal not used in the silicidation of the active surface is removed by, for example, a wet removal process. For example, unreacted metal material is removed selective to the salicide contacts. A second anneal may be performed to enhance the material properties of the silicide layer, for example, lower resistivity. RTA may be employed for the first and second annealing processes. Other techniques may also be used to form the salicide contacts 190.

Additional processes may be performed to complete the device. Such processes may include forming contacts (not shown) coupled to contact regions of the transistor, one or more inter level dielectric (ILD) layers, interconnect metal levels, contact plugs, final passivation, dicing, packaging and testing.

FIGS. 4a-4d show cross-sectional views of another embodiment of a process 400 for forming a device. The device formed by process 400 is similar or the same as that shown in FIGS. 2a-2d. The process 400 is similar to the process 300 as described in FIGS. 3a-3g. In the interest of brevity, common elements and processes may not be described or described in detail.

Figure 4A:
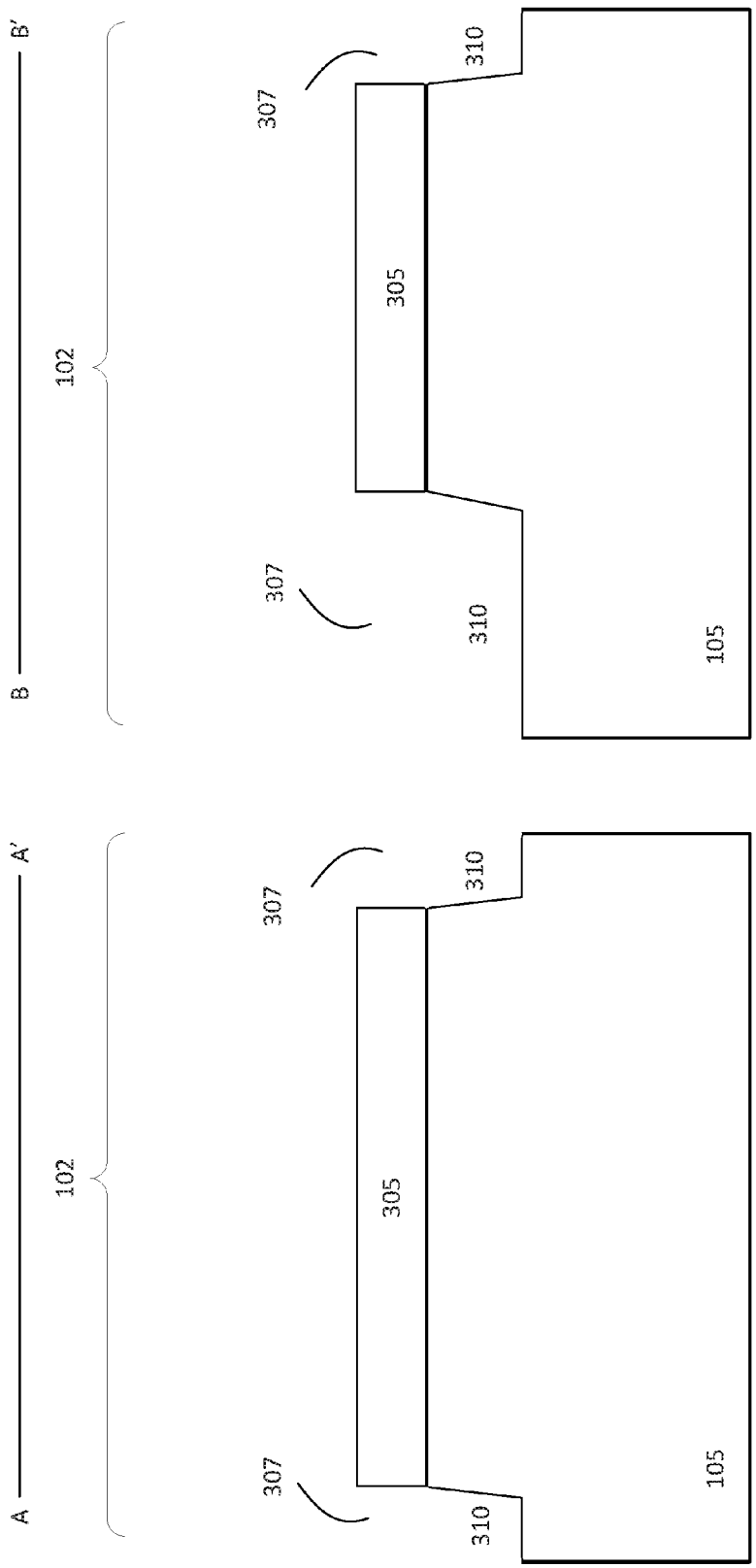
FIGS. 4*a*-4*d* show cross-sectional views of another embodiment of a process for forming a device.
Figure 4B:

Referring to FIG. 4a, a substrate 105 is provided. The substrate is prepared with a device region 102 and isolation regions. For example, the substrate may be prepared with a device isolation region 180 and isolation fingers 188. In one embodiment, forming the device isolation region may also form the isolation fingers. The isolation regions are, for example, STI regions. Various processes can be employed to form the STI regions having the configuration as shown and as described in FIGS. 2a-2d. For example, the substrate can be etched using etch and mask techniques to form trenches 310 corresponding to locations where isolation regions are to be formed. The trenches are then filled with dielectric materials such as silicon oxide. CMP can be performed to remove excess oxide and provide a planar substrate top surface, as shown in FIG. 4b.

After the isolation regions are formed, the process continues as described in FIGS. 3c-3f to form the first and second device wells 150 and 170, transistor gate 140 and spacers 148. The gate, in one embodiment, overlaps a portion of the drift well and second well while the one or more isolation fingers underlap the gate and extends slightly into the drift well without affecting the resistance of the drift well.

Figure 4C:
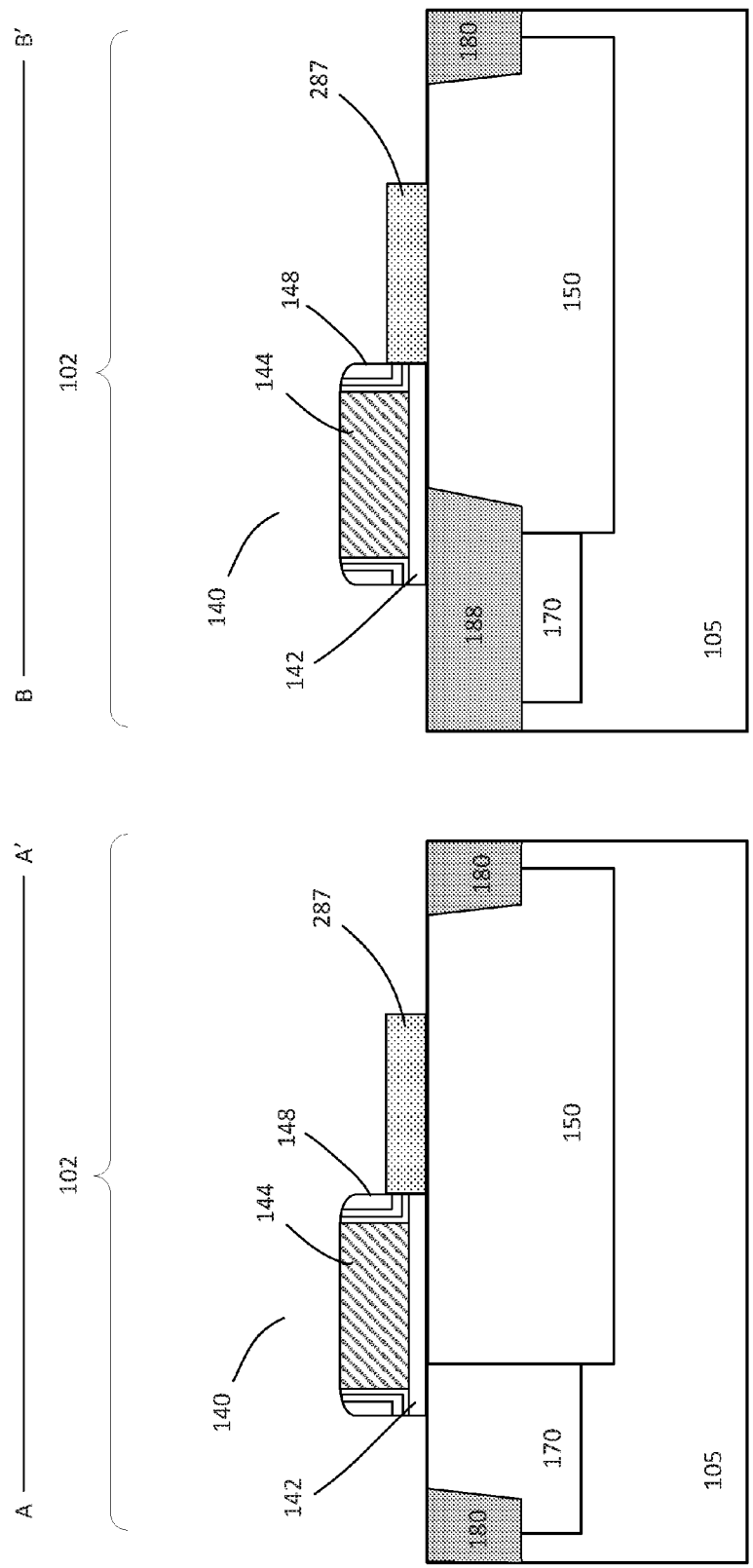

Referring to FIG. 4c, a salicide block layer is formed on the substrate. The salicide block layer prevents formation of salicide contacts on the substrate. In one embodiment, the salicide block layer is a dielectric layer. For example, the salicide block layer may be oxide, nitride, oxynitride or a combination thereof. Other types of dielectric materials or block materials, such as those compatible for semiconductor processing, may also be useful. In some embodiments, the salicide block layer may be a composite layer having a plurality of layers which form, for example, a block stack or sandwich. Other configurations of salicide block layers may also be useful. Various techniques may be used to form the salicide block layer. For example, the salicide block layer may be formed by CVD.

The salicide block layer is patterned to form a salicide block 287. The salicide block layer may be patterned using mask and etch techniques. For example, a photoresist layer is formed over the salicide block layer and patterned using a lithographic mask, exposing portions of the salicide block layer to be removed. An anisotropic etch, such as RIE, is performed to remove exposed portions of the salicide block layer. To improve lithographic resolution, an ARC can be provided beneath the photoresist. Other techniques for patterning the salicide block layer may also be useful.

The salicide block is disposed on the substrate over the drift region 185. The salicide block prevents formation of a salicide contact over a portion of the drift region. As shown, the salicide block is aligned with the gate sidewall on the drain side and extends over a portion of the drift region. Other suitable configuration for the salicide block may also be useful.

Figure 4D:
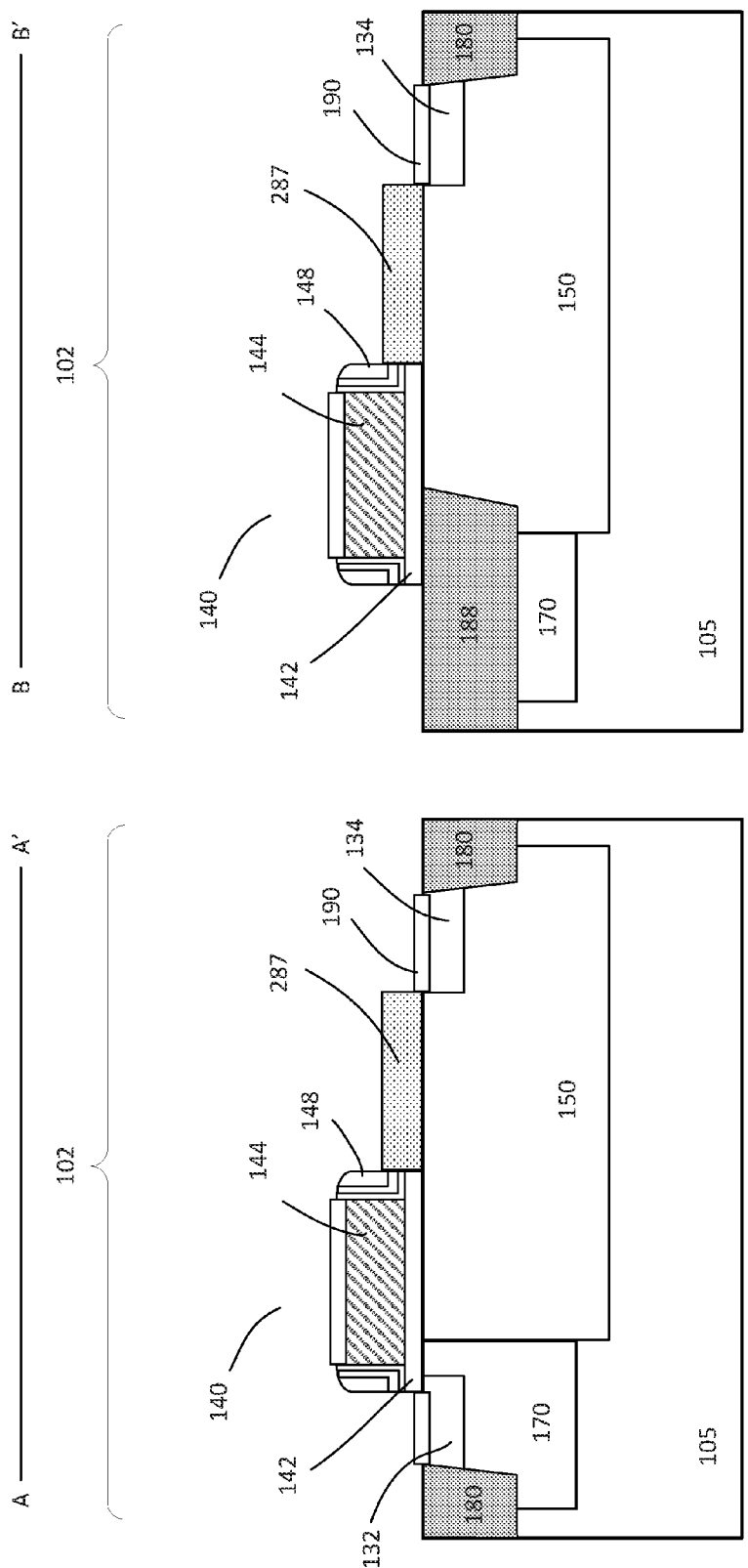

Referring to FIG. 4d, the process continues as described in FIG. 3g to form the device 200 as shown and as described in FIGS. 2a-2d. In one embodiment, the transistor source and drain regions 132 and 134 are self-aligned with respect to the device region. For example, an implant is used to introduce dopants into the substrate portion unprotected by the gate, spacers, isolation regions and salicide block to form the source and drain regions. The salicide block, for example, displaces the drain region away from the drain side of the gate.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A high voltage device comprising:
    a substrate having a device region, wherein the device region comprises a source region and a drain region defined thereon;

a transistor having a transistor gate disposed on the device region, wherein the transistor gate comprises a gate electrode and a gate dielectric disposed over the substrate and between the source and drain regions;

first and second device wells disposed in the substrate within the device region, wherein the first device well is adjacent to a second side of the transistor gate and the second device well is adjacent to a first side of the transistor gate;

isolation regions disposed within the substrate, wherein the isolation regions comprise a device isolation region surrounding the device region and one or more isolation fingers extending partially into the device region from a portion of the device isolation region adjacent to the source region; and wherein the one or more isolation fingers completely traverse the source region and extend beyond the source region to partially underlap the gate dielectric of the transistor gate.

2. The device of claim 1 wherein the source region is adjacent to the first side of the transistor gate and the drain region is displaced away from the second side of the transistor gate.

3. The device of claim 1 comprising a transistor channel region disposed in the substrate directly below the transistor gate, wherein the one or more isolation fingers completely traverse the transistor channel region.

4. The device of claim 1 wherein the second device well encompasses the source region and the first device well encompasses the drain region, wherein the first device well includes first polarity type dopants and second device well includes second polarity type dopants different from the first polarity type.

5. The device of claim 4 wherein the isolation regions further comprise an internal isolation region disposed within the first device well.

6. A high voltage device comprising:
a substrate having a device region, wherein the device region comprises a source region and a drain region defined thereon;
a transistor having a transistor gate disposed on the device region, wherein the transistor gate comprises a gate electrode and a gate dielectric disposed over the substrate, wherein
 the source region is disposed adjacent to the transistor gate and underlaps a source side of the transistor gate, and
 the drain region is displaced away from a drain side of the transistor gate;
a channel region disposed adjacent to the source region and underlapping the transistor gate;
first and second device wells disposed in the substrate within the device region, wherein the first device well encompasses the drain region and underlaps a first portion of the transistor gate, and the second device well encompasses the source region and underlaps a second portion of the transistor gate;
isolation regions disposed within the substrate, wherein the isolation regions comprise a device isolation region surrounding the device region and one or more isolation fingers extending into the device region from a portion of the device isolation region adjacent to the source region; and wherein the one or more isolation fingers completely traverse the source region and extend beyond the source region to underlap a portion of the gate dielectric of the transistor gate.

7. The device of claim 6 wherein the first device well includes first polarity type dopants and the second device well includes second polarity type dopants different from the first polarity type.

8. The device of claim 6 wherein the one or more isolation fingers extend to a depth below the source and drain regions.

9. The device of claim 6 wherein the one or more isolation fingers extend completely across the second device well.

10. The device of claim 8 wherein the one or more isolation fingers have a rectangular shape when viewed from top.

11. The device of claim 8 wherein the one or more isolation fingers are symmetrical and distributed uniformly along the source region.

12. The device of claim 6 wherein the one or more isolation fingers extend across and beyond the channel region.

13. The device of claim 6 wherein the isolation regions further comprise an internal isolation region disposed within the first device well and adjacent to the drain region.

14. A high voltage device comprising:
a substrate having a device region, wherein the device region comprises a source region and a drain region defined thereon;
a transistor gate disposed over the substrate, wherein the transistor gate comprises a gate electrode and a gate dielectric disposed between the source and drain regions;
isolation regions disposed within the substrate, wherein the isolation regions comprise a device isolation region surrounding the device region and one or more isolation fingers extending partially into the device region from a portion of the device isolation region adjacent to the source region; and
wherein the one or more isolation fingers extend through the source region to underlap a portion of the transistor gate, wherein the one or more isolation fingers include a depth deeper than the source region.

15. The device of claim 14 comprising first and second device wells disposed in the substrate within the device region, wherein the first device well encompasses the drain region and the second device well encompasses the source region.

16. The device of claim 15 wherein the one or more isolation fingers extends through the second device well and extends into a portion of the first device well.

17. The device of claim 15 wherein the drain region is displaced away from the gate.

18. The device of claim 15 comprising a transistor channel region disposed within the second device well, wherein the one or more isolation fingers completely traverse the transistor channel region and define active sub-regions of the transistor channel region.

* * * * *